(12) United States Patent
Joshi et al.

(10) Patent No.: US 8,767,501 B2
(45) Date of Patent: Jul. 1, 2014

(54) SELF-RECONFIGURABLE ADDRESS DECODER FOR ASSOCIATIVE INDEX EXTENDED CACHES

(75) Inventors: Rajiv V. Joshi, Yorktown Heights, NY (US); Ajay N. Bhoj, Princeton, NJ (US)

(73) Assignee: International Business Machines Corporation, Armonk, NY (US)

(*) Notice: Subject to any disclaimer, the term of this patent is extended or adjusted under 35 U.S.C. 154(b) by 24 days.

(21) Appl. No.: 13/550,762

(22) Filed: Jul. 17, 2012

(65) Prior Publication Data

US 2014/0025881 A1    Jan. 23, 2014

(51) Int. Cl.
*G11C 8/10* (2006.01)
(52) U.S. Cl.
USPC .................. 365/230.06; 365/230.03
(58) Field of Classification Search
USPC .......................... 365/230.06, 230.03
See application file for complete search history.

(56) References Cited

U.S. PATENT DOCUMENTS

| | | | |
|---|---|---|---|
| 5,353,431 A | 10/1994 | Doyle et al. | |
| 5,530,958 A | 6/1996 | Agarwal et al. | |
| 6,405,292 B1 | 6/2002 | Joseph et al. | |
| 6,516,387 B1 | 2/2003 | Auracher | |
| 7,924,590 B1 * | 4/2011 | Starovoitov et al. | 365/49.17 |
| 8,527,488 B1 * | 9/2013 | Starovoitov | 707/706 |
| 2004/0078544 A1 | 4/2004 | Lee et al. | |
| 2005/0125613 A1 | 6/2005 | Kim et al. | |
| 2005/0131995 A1 | 6/2005 | Chase et al. | |
| 2007/0005897 A1 | 1/2007 | Bink et al. | |
| 2008/0168254 A1 | 7/2008 | Corrigan et al. | |
| 2008/0172529 A1 | 7/2008 | Ringe et al. | |

OTHER PUBLICATIONS

Hallnor, E.G. et al., "A Fully Associative Software-Managed Cache Design" Proceedings of the 27th International Symposium on Computer Architecture (May 2000) pp. 107-116, vol. 28, No. 2, Department of Electrical Engineering and Computer Science, The University of Michigan, Ann Arbor, MI.

Zhang, C., "An Efficient Direct Mapped Instruction Cache for Application-Specific Embedded Systems" Proceeding CODES+ISSS '05 Proceedings of the 3rd IEEE/ACM/IFIP international conference on Hardware/software codesign and system synthesis (Sep. 2005) pp. 45-50, Department of Computer Science and Electrical Engineering, University of Missouri-Kansas City, Kansas City, MO.

* cited by examiner

*Primary Examiner* — Michael Tran
(74) *Attorney, Agent, or Firm* — Scully, Scott, Murphy & Presser, P.C.; Preston J. Young, Esq.

(57) ABSTRACT

Associative index extended (AIX) caches can be functionally implemented through a reconfigurable decoder that employs programmable line decoding. The reconfigurable decoder features scalability in the number of lines, the number of index extension bits, and the number of banks. The reconfigurable decoder can switch between pure direct mapped (DM) mode and direct mapped-associative index extended (DM-AIX) mode of operation. For banked configurations, the reconfigurable decoder provides the ability to run some banks in DM mode and some other banks in DM-AIX mode. A cache employing this reconfigurable decoder can provide a comparable level of latency as a DM cache with minimal modifications to a DM cache circuitry of an additional logic circuit on a critical signal path, while providing low power operation at low area overhead with SA cache-like miss rates. Address masking and most-recently-used-save replacement policy can be employed with a single bit overhead per line.

19 Claims, 11 Drawing Sheets

SELF-RECONFIGURABLE ADDRESS DECODER FOR ASSOCIATIVE INDEX EXTENDED CACHES

BACKGROUND

The present disclosure generally relates to a method of providing direct mapped (DM) cache access and direct mapped-associative index extended (DM-AIX) cache access in a memory circuit employing a self-reconfigurable decoder, and a semiconductor circuit for implementing the same employing a new cache replacement scheme for (DM-AIX) caches.

To overcome the central processing unit (CPU) to main memory performance gap, a cache hierarchy exploiting locality is needed. System performance is heavily dependent upon average memory address time (AMAT). Most L1 and L2 caches currently in use employ either direct mapped (DM) caches, set associative (SA) caches, or fully associative (FA) caches.

Direct-mapped caches and, to an extent, set associative caches suffer from conflict misses. Average memory address times at L1 cache level is the sum of the L1 hit time and the product of L1 miss rate and L1 miss penalty in time. L1 miss penalty is the sum of L2 hit time and the product of L2 miss rate and L2 miss penalty in time.

In general, hit time reduction can be provided by technology scaling improvements because the delay time Δt is given by the product of the capacitance and the voltage of the circuit device divided by the current of the circuit. Further, hit time reduction can be effected by astute circuit design, which tends to provide incremental benefits with each technology generation. Miss rates can be reduced by enhanced cache organization and/or increased cache capacity. In general, increased capacity of the cache decreases the miss rate asymptotically. The miss rate is affected by the type of the cache. Specifically, direct-mapped caches tend to have a larger miss rate than set associative caches at the same capacity level.

The various types of caches known in the art require tradeoffs between design and miss rate. For example, direct-mapped caches are fast and easy to design and verify, but suffer from conflict misses and high miss rates. Set associative caches are slower because more comparators are employed during tag match, and replacement policies get complicated. Fully associative caches are slowest and hardest to design, do not have conflict misses, and provide the least miss rate. Further, even simple line replacement policies become impractical in fully associative caches.

BRIEF SUMMARY

Associative index extended (AIX) caches can provide a level of associativity in a DM cache addressed using 'n' index bits by adding an extra 'k' index extension bits, thereby enabling SA cache-like miss rates with DM cache-like access latencies. Alternatively, AIX caches can use 'n' index bits but have only $2^{(n-k)}$ addressable physical lines, thereby reducing physical cache area dramatically. The AIX caches can be functionally implemented through a reconfigurable decoder that enables programmable line decoding. The reconfigurable decoder features scalability in the number of lines, the number of index extension bits, and the number of banks. The reconfigurable decoder is fully compatible with current architectures. The reconfigurable decoder can switch between pure direct mapped (DM) mode and direct mapped-associative index extended (DM-AIX) mode of operation. For banked configurations, the reconfigurable decoder provides the ability to run some banks in DM mode and some other banks in DM-AIX mode. A cache employing this reconfigurable decoder can provide a comparable level of latency as a DM cache with minimal modifications to a DM cache circuitry of an additional logic circuit on a critical signal path, and provides low power operation at low area overhead.

According to an aspect of the present disclosure, a memory circuit includes at least one memory bank including an array of memory cells, and a decoder circuit including a reconfigurable decoder. The relationship between address bits provided through address search lines to the reconfigurable decoder and data lines within a decoder memory of the reconfigurable decoder is programmable within the reconfigurable decoder based on an input to the reconfigurable decoder provided through the address search lines.

According to another aspect of the present disclosure, a semiconductor circuit includes at least one memory bank including an array of memory cells and a reconfigurable decoder including an array of content addressable memory (CAM) cells. A relationship between address bits provided through address search lines to the reconfigurable decoder and data lines within a decoder memory of the reconfigurable decoder is programmable within the reconfigurable decoder based on an input to the reconfigurable decoder provided through the address search lines.

According to yet another aspect of the present disclosure, a memory circuit includes: at least one memory bank including an array of memory cells; and a decoder circuit configured to access a row of the array of memory cells through two alternate cache access schemes including direct mapped cache access mode through a first decoder and associative index extended cache access mode through a second decoder.

According to even another aspect of the present disclosure, a semiconductor circuit includes: a first decoder configured to provide a first output to a multiplexer based on an address input; a second decoder including an array of content addressable memory (CAM) cells and configured to provide a second output to the multiplexer based on the address input; and a word line driver configured to drive a word line selected by a multiplexed output from the multiplexer.

According to still another aspect of the present disclosure, a memory circuit, a decoder circuit, and an address mask register. The memory circuit includes at least one memory bank including an array of memory cells. The decoder includes a reconfigurable decoder. A relationship between address bits provided through address search lines to the reconfigurable decoder and data lines within a decoder memory of the reconfigurable decoder is programmable within the reconfigurable decoder based on an input to the reconfigurable decoder provided through the address search lines. The address mask register is configured to receive index bits from address search lines, to retain a first subset of the index bits corresponding to asserted bits of an address mask, to delete a second subset of the index bits corresponding to de-asserted bits of the address mask, to provide the first subset of the index bits to the reconfigurable decoder to access a line of memory cells within the reconfigurable decoder corresponding to the first subset of the index bits, and to write the index bits to the line of memory cells.

According to a further aspect of the present disclosure, a method of operating a memory circuit is provided. The memory circuit includes at least one memory bank including an array of memory cells and a decoder circuit. The array of memory cells includes a most recently used (MRU) bit per cache line. The decoder circuit includes a reconfigurable decoder. A relationship between address bits provided through address search lines to the reconfigurable decoder and data lines within a decoder memory of the reconfigurable decoder is programmable within the reconfigurable decoder based on an input to the reconfigurable decoder provided through the address search lines. The method further includes selecting a cache line for storing new data among memory cells having MRU bits that do not indicate most recent usage.

DETAILED DESCRIPTION

As stated above, the present disclosure relates to a method of providing direct mapped (DM) cache access and direct mapped-associative index extended (DM-AIX) in a memory circuit employing a self-reconfigurable decoder, and a semiconductor circuit for implementing the same along with a new cache replacement policy for DM-AIX caches, which are now described in detail with accompanying figures. It is noted that like reference numerals refer to like elements across different embodiments. The drawings are not necessarily drawn to scale.

Figure 1:
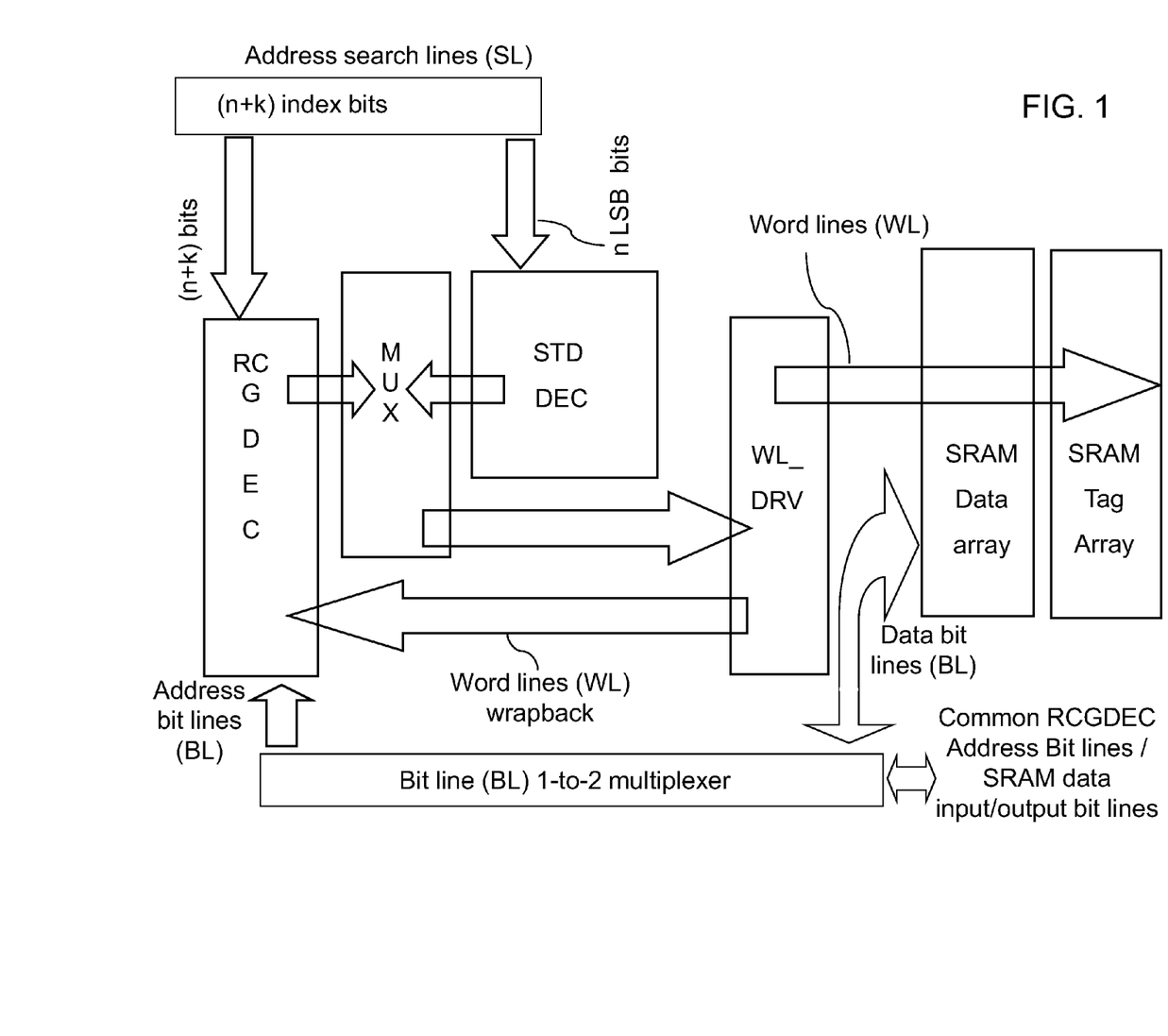
FIG. 1 is a schematic diagram of an exemplary semiconductor circuit to implement a DM-AIX cache according to an embodiment of the present disclosure.

Referring to FIG. 1, a semiconductor circuit having a DM-AIX configuration for a memory bank is illustrated with a static random access (SRAM) data and tag memory array. Address to be accessed in the memory bank is provided through address search lines (SL) to a decoder circuit according to an embodiment of the present disclosure. The decoder circuit includes a standard decoder (STD DEC), a reconfigurable decoder (RCG DEC), and a multiplexer (MUX). The multiplexer output from the multiplexer is provided to a word line driver (WL DRV), which drives a word line in the memory bank. The physical location of the tag array with respect to the SRAM data array is flexible. For example, the tag array can be located between RCGDEC and WLDRV in FIG. 1 or to the extreme left, i.e., at the opposite side of SRAM data array with respect to the WL DRV.

The semiconductor circuit is a memory circuit including at least one memory bank and a decoder circuit. Each of the at least one memory bank includes an array of memory cells. The decoder circuit is configured to access a row of the array of memory cells through two alternate cache access schemes including direct mapped cache access mode through a first decoder, which is the standard decoder, and associative index extended cache access mode through a second decoder, which is the reconfigurable decoder. The first decoder, i.e., the standard decoder, is configured to provide a first output to a multiplexer based on an address input. The second decoder is configured to provide a second output to the multiplexer based on the address input. The first decoder and the second decoder are configured to generate the first output or the second output, respectively, based on an address input to common address search lines connected to the first decoder and the second decoder. In one embodiment, the reconfigurable decoder row width having '(n+k)' bits is greater than the address width of 'n' bits supplied to the standard decoder. Hence, the DM-AIX mode provides a level of associativity in a DM cache by most effectively addressing/utilizing the $2^n$ physical data lines of the SRAM array bank using a larger address space addressed using (n+k) bits.

A multiplexer is configured to generate a multiplexed output by selecting an output from a first output of the first decoder, i.e., the standard decoder, and a second output of the second decoder, i.e., the reconfigurable decoder, depending on a cache access scheme in use.

The at least one memory bank includes a plurality of word lines, and each of the plurality of word lines is configured to drive a row of decoder memory cells in the second decoder. A word line driver is configured to drive a word line selected by the multiplexed output among a plurality of word lines in the at least one memory bank.

The contents of the second decoder are reconfigurable employing the word line driver. The word line driver is configured to access word lines of the decoder memory cells within the second decoder. The second decoder includes an array of decoder memory cells. The second decoder can include an array of content addressable memory (CAM) cells.

Each of the plurality of word lines extends into the array of CAM cells as a word line of the array of CAM cells. The word line driver is configured to access a selected word line of the array of CAM cells. The word line driver determines the selected word line based on the multiplexed output.

In one embodiment, each of the plurality of word lines is configured to drive a row of decoder memory cells in the second decoder. The decoder includes an array of decoder memory cells, and an output of the word line driver determines a row of the array of decoder memory cells to be accessed. The semiconductor circuit can include address bit lines connected to the second decoder, and not to the first decoder. The address bit lines are configured to provide data bits to be written in an accessed row of the array of decoder memory cells.

In one embodiment, a bit line multiplexer configured to provide address bits through address bit lines connected to the second decoder (RCGDEC) and to communicate data bits through data bit lines connected to at least one memory bank of the SRAM array. The address bit lines can be multiplexed with the SRAM array input/output data bit lines depending on the organization of the SRAM array peripheral circuitry. In this case, a bit line multiplexer (such as a 1-to-2 multiplexer) can be employed to multiplex address bit lines between the second decoder, i.e., the reconfigurable decoder, and the SRAM array. During the writing of values into the reconfigurable decoder, the address bit lines are gated to the SRAM array input, i.e. they are blocked from the SRAM array. The circuitry can be configured so that it is only possible to use the bit lines to either write/read into the reconfigurable decoder or read/write from the SRAM array, but rendering it impossible to perform both operations simultaneously.

In one embodiment, each word line driven by the word line driver is a common word line for a row of memory cells in a memory bank and for a row of the array of CAM cells. Common address search lines are connected to the first decoder and the second decoder, and are configured to provide the address input. Address bit lines can be connected to the second decoder, and configured to provide data bits to be written in a row of the array of CAM cells accessed by the selected word line.

A multiplexer is connected to first decoder output lines of the standard decoder and to second decoder output lines of the reconfigurable decoder on the input side. Depending on the operational mode of the multiplexer, the multiplexer provides an output that is selected from the data in the first decoder output lines as generated by the standard decoder or the data present in the second decoder output lines as generated by the reconfigurable decoder. Specifically, the multiplexer provides the data in the first decoder output lines as the selected output during a DM mode (which is also referred to as a standard mode), or provides the data in the second decoder output lines as the selected output during a DM-AIX mode (which is also referred to as a reconfigured mode).

The word line driver drives a selected word line that corresponds to the selected output of the multiplexer. Thus, the address of the word line within the memory bank to be driven by the word line driver can be selected from the output of the standard decoder and the output of the reconfigurable decoder.

Further, the word line driver wraps back to the reconfigurable decoder to provide independent read/write capabilities to the memory elements of the reconfigurable decoder. The memory elements of the reconfigurable decoder can be implemented as content addressable memory (CAM) cells. In this case, the word line driver lines extend into the memory banks of the memory chip also extend into the CAM cell array within the reconfigurable decoder as word lines for the CAM cell array.

The reconfigurable decoder provides a 'self-reconfiguring' capability by providing word lines that wrap back to program the decoder CAM cell array. The relationship between address bits provided through address search lines to the reconfigurable decoder and the data lines within the decoder memory of the reconfigurable decoder is programmable within the reconfigurable decoder based on an input to the reconfigurable decoder provided through the address search lines. In one embodiment, the reconfigurable decoder can be multiplexed (MUXed) with the standard decoder, thereby enabling four different modes of operation. The multiplexed decoders along the programming capabilities of the reconfigurable decoder enable different banks to run in DM mode or DM-AIX mode independent of the operational mode of other banks.

In one embodiment, the semiconductor circuit can be operated in a DM cache mode or in a DM-AIX cache mode. A multiplexer (MUX) enables easy switching between the DM mode and the DM-AIX mode. The operational mode of the semiconductor circuit is switchable between the DM mode and the DM-AIX mode as needed.

At the start-up of the circuit of FIG. 1, the reconfigurable decoder can be initialized employing the standard decoder. During the initialization, contents of the reconfigurable decoder memory cells are compared to ensure that no two rows of the array of decoder memory cells have identical contents. This process ensures that only one word line of the array of memory cells in the memory bank is triggered by the reconfigurable decoder. The latter can also be achieved by writing different values into each row of the reconfigurable decoder by employing the standard decoder. Specifically, the standard decoder is employed to reconfigure the reconfigurable decoder with array read/write for random line replacement.

Once the reconfigurable decoder is reconfigured, the circuit of FIG. 1 can be operated for array read and/or write operations employing the reconfigured decoder to decode the address input, which is provided to common address search lines connected to the standard decoder and the reconfigurable decoder.

In the DM-AIX mode, if an address is unavailable during a read operation or a write operation that could lead to a capacity/conflict miss if unresolved, the reconfigurable decoder can be self-reconfigured without external command in order to resolve the address unavailability or the address conflict. The self-reconfiguration is triggered by an address-unavailability detection circuitry built into the reconfigurable decoder. The address-unavailability detection circuitry is triggered by detection of any address unavailability of address conflict, and alters the contents of the array of the decoder memory cells in order to reassign or remove an address corresponding to the address unavailability or the address conflict.

Specifically, in the DM-AIX mode for self-reconfigurability, the search address on the search lines triggers (activates) word lines through the RCGDEC and writes a new address into itself, which is supplied through the bit lines of the array of the decoder memory cells into the decoder memory cells. If the decoder memory cells are CAM cells, the search address on the search lines of the reconfigurable decoder triggers word lines and writes a new address supplied through the bit lines of the CAM cells into the CAM cells.

Figure 2:
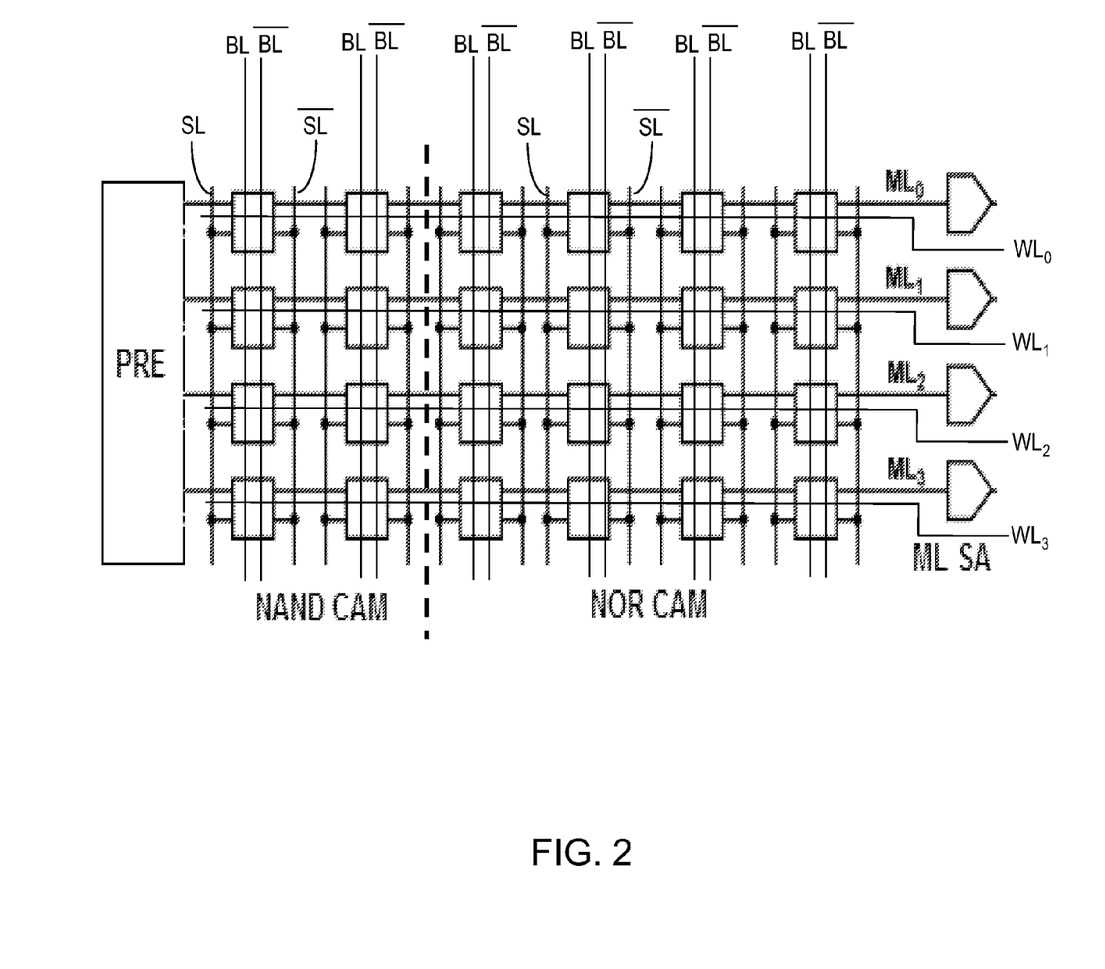
FIG. 2 is a circuit schematic of a reconfigurable decoder according to an embodiment of the present disclosure.

Referring to FIG. 2, an example of a reconfigurable decoder implemented using CAM cells is illustrated. The reconfigurable decoder includes an array of decoder memory cells, which is schematically represented as an array of rectangles in FIG. 2. Each decoder memory cell is a CAM cell in this example.

Figure 3A:
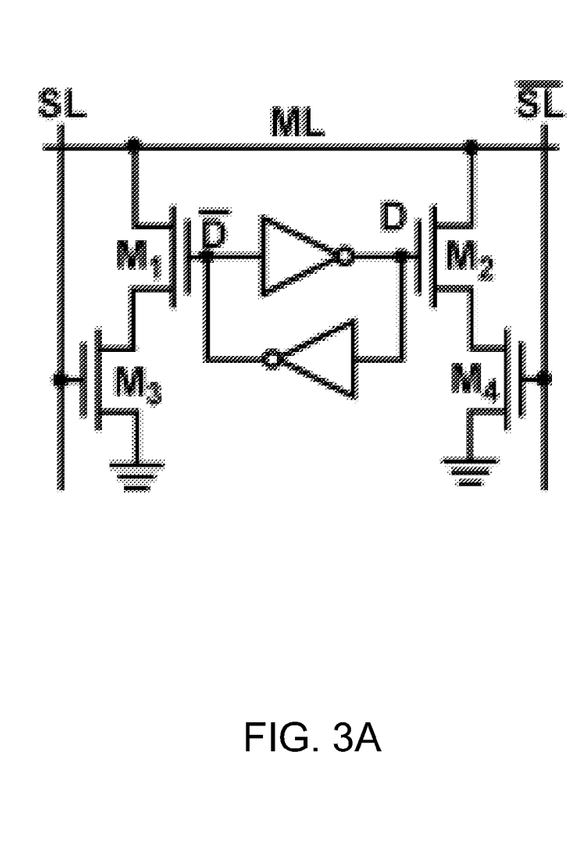
FIG. 3A is a circuit schematic for a 10 transistor (10T) NOR-type CAM cell that can be employed in a reconfigurable decoder of the present disclosure.
Figure 3B:
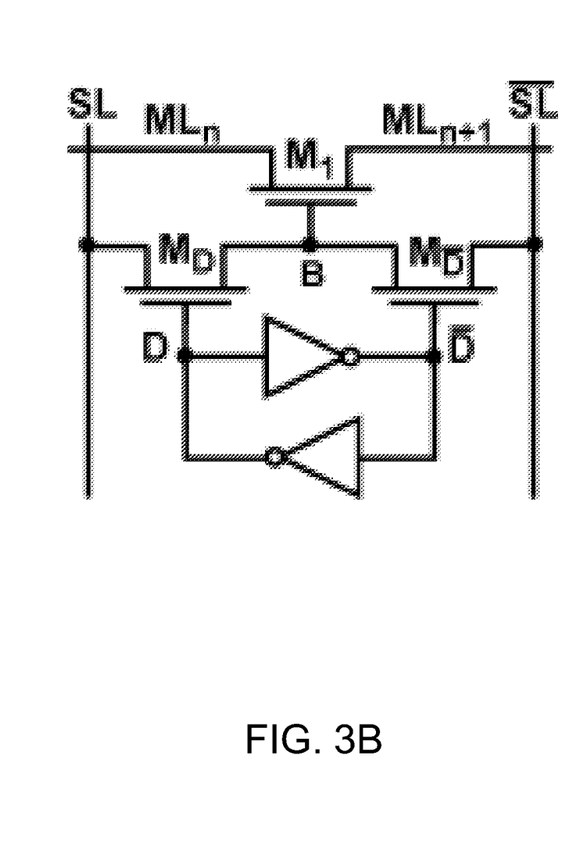
FIG. 3B is a circuit schematic for a 9 transistor (9T) NAND-type CAM cell that can be employed in a reconfigurable decoder of the present disclosure.

The CAM cells can be any type of CAM cell known in the art. For example, the CAM cells can be a 10 transistor (10T) NOR-type CAM cell illustrated in FIG. 3A, or can be a 9 transistor (9T) NAND-type CAM cell illustrated in FIG. 3B. In FIGS. 3A and 3B, each SL refers to a primary search line, each $\overline{SL}$ refers to a complementary search line, and ML, $ML_n$, and $ML_{n+1}$ refer to match lines. Each pair of D and $\overline{D}$ refer to a pair of a data bit and a complementary data bit. $M_1$, $M_2$, $M_3$, $M_4$, $M_D$, and $M_{\overline{D}}$ refer to various transistors within a CAM cell. The back-to-back inverter between the D node and $\overline{D}$ node within each CAM cell can be implemented, for example, by a 6 transistor (6T) static random access memory (SRAM) cell known in the art. The primary bit line and the complementary bit line for each SRAM cell corresponds to the D node and the $\overline{D}$ node within each CAM cell, respectively. A word line (not shown in FIGS. 3A and 3B) is provided within each SRAM cell.

Referring back to FIG. 2, each SL refers to a primary search line, each $\overline{SL}$ refers to a complementary search line, and $ML_0$, $ML_1$, $ML_2$, and $ML_3$ refer to match lines. While only four match lines are illustrated in FIG. 2, the number of the match lines can be scaled without limitation. Each row of the reconfigurable decoder is accessed by a word line $WL_i$, wherein i is a number between 0 to N-1. N is the total number of the word lines within the reconfigurable decoder. "PRE" refers to a pre-charge circuitry for the match lines.

The reconfigurable decoder of FIG. 2 includes a hybrid array of CAM cells that includes an array of NAND CAM cells and an array of NOR CAM cells. The reconfigurable decoder of FIG. 2 can be modified, depending on performance requirements, to include an array of NAND CAM cells only, or an array of NOR CAM cells only.

The search lines SL in FIG. 2 are the same as the address search lines SL schematically shown in FIG. 1, which are connected to the standard decoder and to the reconfigurable decoder. Each BL refers to a bit line (primary bit line), $\overline{BL}$ refers to a complementary bit line. The set of bit lines BL is the same as the address bit lines BL illustrated in FIG. 1. The address bit lines can also be multiplexed as data lines to the SRAM array thereby permitting independent read/write facility into the reconfigurable decoder and SRAM array without increasing the number of bitline ports to the bank.

According to embodiments of the present disclosure, memory to cache AIX remapping can be implemented through a self-reconfiguring address decoder, i.e., the reconfigurable decoder. The reconfigurable decoder can be based on pure NOR CAM cells, or can be based on hybrid CAM cells. The CAM cells can be applied for programmable row address decoding.

The CAM array based reconfigurable decoder has layout similarities to an SRAM array. The choice of the unit CAM cell to be employed in the reconfigurable decoder affects the performance of the reconfigurable decoder. In one embodiment, the entirety of the decoder memory cells can employ 10T NOR CAM cells to provide fast, simple layout that is not as power efficient as the 9T NAND CAM cells. In another embodiment, the entirety of the decoder memory cells can employ 9T NAND CAM cells, which act as screening bits to save power through selective precharge. However, 9T NAND CAM cells can be slower and have a complex layout. A hybrid of 10T NOR and 9T NAND CAM cells can also be used to balance power versus latency.

Figure 4A:
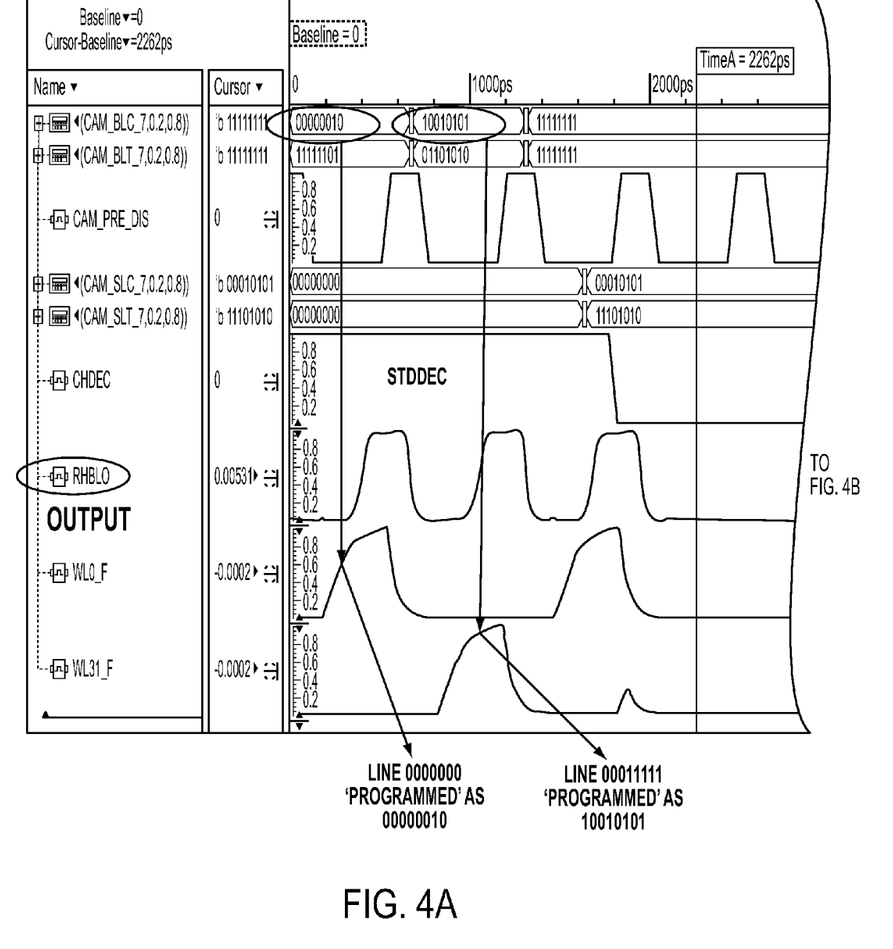
FIG. 4A is a first part of a timing diagram illustrating the operation of an exemplary decoder circuit of the present disclosure.
Figure 4B:
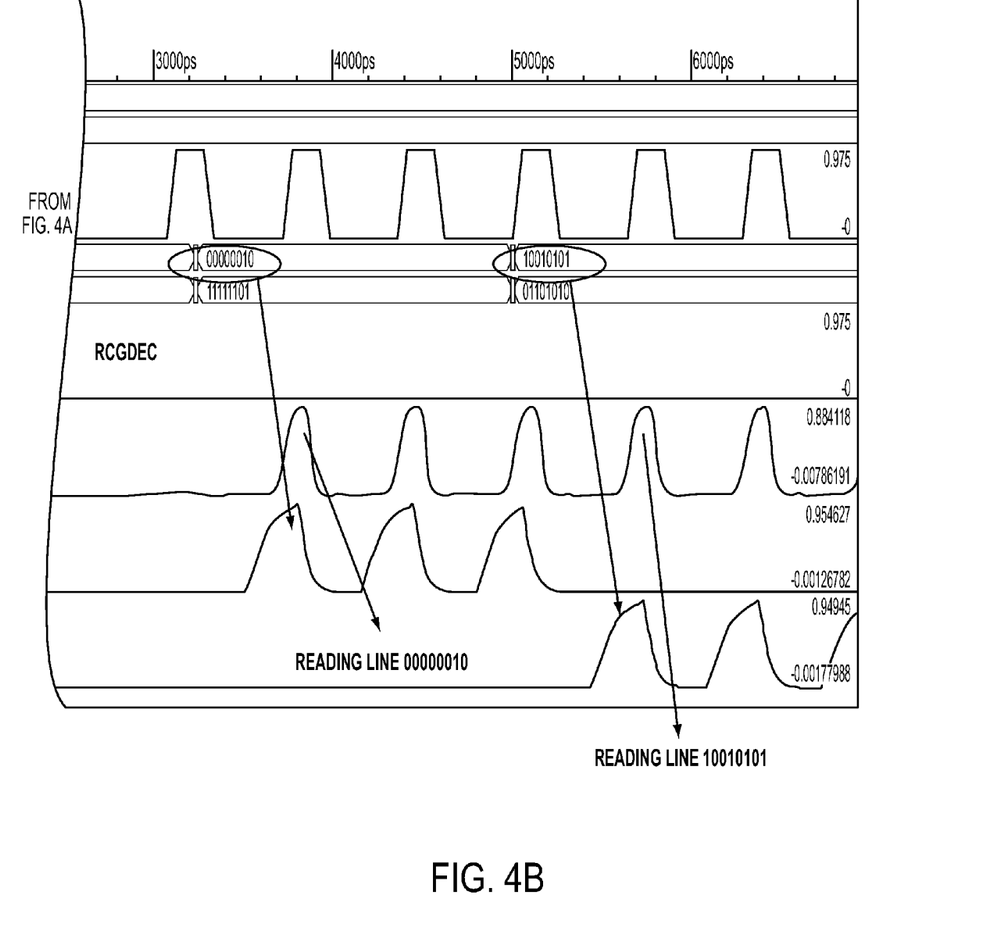
FIG. 4B is a second part of the timing diagram illustrating the operation of the exemplary decoder circuit of the present disclosure.

Referring to FIGS. 4A and 4B, a time diagram illustrates the operation of the reconfigurable decoder according to an embodiment of the present disclosure. After the first clock cycle, the physical word line '00000000' of the memory bank is programmed as reconfigured word line '00000010' in the RCGDEC by placing '00000010' at the address bitlines and triggering the standard decoder with search address '00000000', during the first clock cycle. During the second clock cycle, the physical word line '00011111' of the memory bank is programmed as reconfigured word line '10010101' in the RCGDEC by placing '10010101' at the address bitlines and triggering the standard decoder with search address '00011111', during the second clock cycle. During the third clock cycle both address bitlines are precharged to '11111111" and choose decoder (CHDEC) is toggled, causing the decoder circuit to switch to a DM-AIX mode.

During the operation of the decoder circuit in the DM-AIX mode, when address '00000010' is provided in the address search lines, the row corresponding to the reconfigured address '00000010' of the RCGDEC or physical address '00000000' of the memory bank is accessed. Likewise, when address '10010101' is provided in the address search lines, the row corresponding to the reconfigured address '10010101' of the RCGDEC or physical address '00011111' of the memory bank is accessed. Further, the RCGDEC can be used to self-reconfigure itself in DM-AIX mode, e.g., by placing address '10010101' in the address search lines, a new reconfigurable address '10000111' in the address bit lines and performing a self-write, the row corresponding to the reconfigured address '10010101' is transformed into reconfigured address '10000111' (not shown in FIG. 4).

The facility to self-reconfigure is critical to cache line replacement in DM-AIX mode where known lines that need to be replaced can only be addressed via the RCGDEC. RCGDEC makes swapping data between two cache lines very easy—i.e. the contents of the RCGDEC addresses can be swapped through the STDDEC or through the RCGDEC instead of reading out, temporary store and write back into SRAM array. So moving address tags can be faster and/or can be performed with less power than moving data lines in some cases.

In one embodiment, a semiconductor circuit of the present disclosure can be operated as a memory circuit in the direct mapped cache access mode through the first decoder during a first time period, and can be operated in the associative index extended cache access mode through the second decoder during a second time period that does not overlap the first time period. The second time period can follow, or precede, the first time period.

In one embodiment, a semiconductor circuit of the present disclosure can be operated as a memory circuit to store data, which can be related to, or unrelated to, data stored in the at least one memory bank. As used herein, first data is unrelated to second data if there is no redundancy or referencing between the first data and the second data. The data is stored in the array of decoder memory cells, which can be an array of CAM cells.

According to one aspect of the present disclosure, the reconfigurable decoder can be employed as data storage cells, i.e., memory cells, in direct access mode. The data stored in the reconfigurable decoder can be any data, and in general, is not related to the data stored in the memory bank.

According to another aspect of the present disclosure, the reconfigurable decoder can be employed as an error correction circuit (ECC) in direct access mode. In this case, faulty word lines within the memory bank can be logically re-routed to physical memory cells of the reconfigurable decoder.

If the reconfigurable decoder is employed as data storage cells or as an ECC, the density of the decoder memory cells as a memory cell can be about 0.5 times the memory density of a static random access memory cell, which typically employs six field effect transistors.

According to yet another aspect of the present disclosure, some portions of the memory bank can be operated in DM mode, and other portions of the memory bank can be operated in DM-AIX mode. If the same decoder circuit including the standard decoder, the reconfigurable decoder, and the multiplexer is employed to access a plurality of banks in conjunction with a word line driver, some memory banks can be operated in DM mode, and some other memory banks can be operated in DM-AIX mode.

In one embodiment, the semiconductor circuit of the present disclosure can be operated as a memory circuit concurrently employing multiple cache access modes. Specifically, a portion of the memory back can be operated in the direct mapped cache access mode through the first decoder, and another portion of the memory bank can be operated in the associative index extended cache access mode through the second decoder.

According to still another aspect of the present disclosure, a Schmitt trigger based match line sense amplifier (MLSA) can be employed. In this case, different low-to-high and high-to-low switching thresholds can be employed for high speed operation. Feedback loops can be employed to reset precharge based on match line evaluation before precharge enable cycle time is complete.

Figure 5:
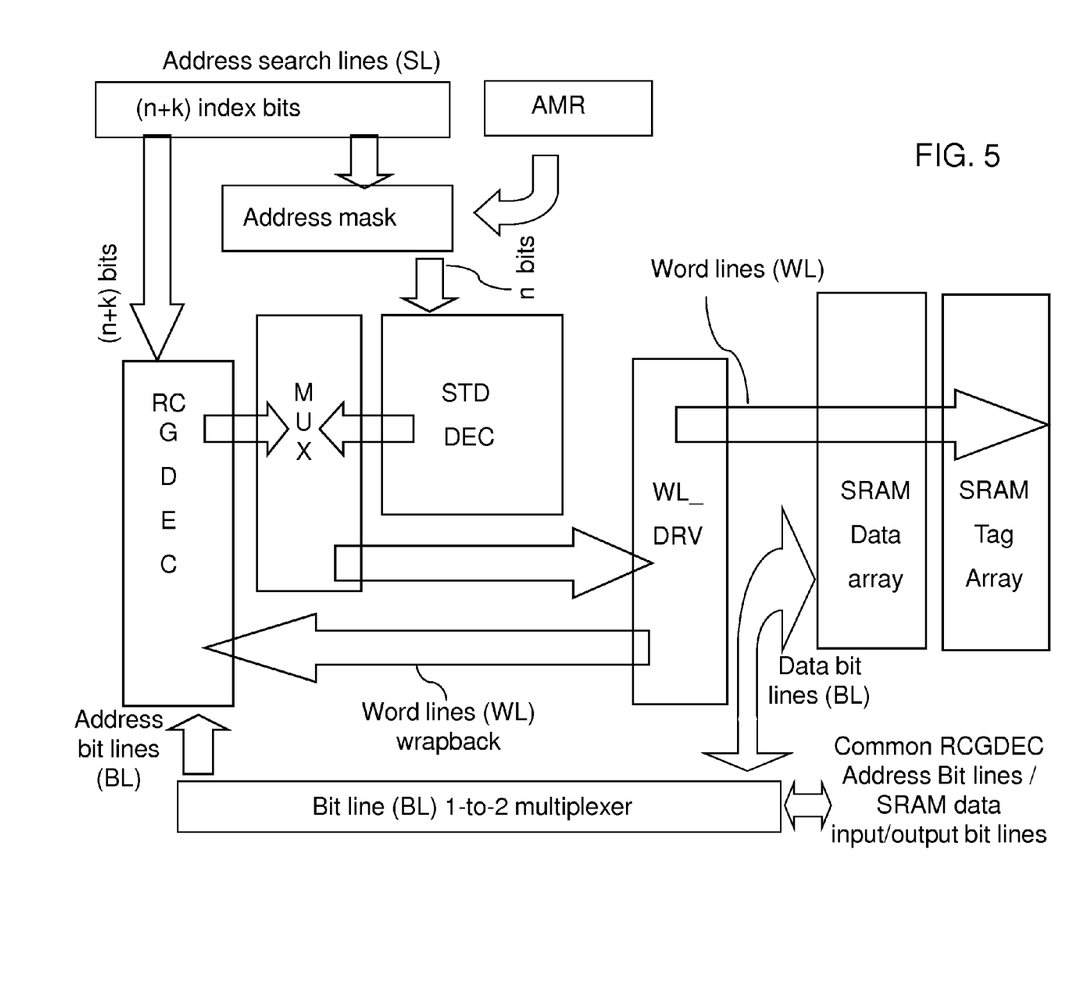
FIG. 5 is a schematic diagram of a variation of the semiconductor circuit of FIG. 1 that includes index address masking according to an embodiment of the present disclosure.

Referring to FIG. 5, a variation of the semiconductor circuit of FIG. 1 is illustrated, which includes an address mask register (AMR) that can be used to screen the index bits supplied to the STDDEC. Along the lines of 'self-reconfigurability' explained above, the AMR provides an additional method to re-map logical lines to physical cache lines in a fine-grained manner. As in FIG. 1, the physical location of the tag array with respect to the SRAM data array is flexible. For example, the tag array can be located between RCGDEC and WLDRV in FIG. 5 or to the extreme left, i.e., at the opposite side of SRAM data array with respect to the WL DRV.

Figure 6:
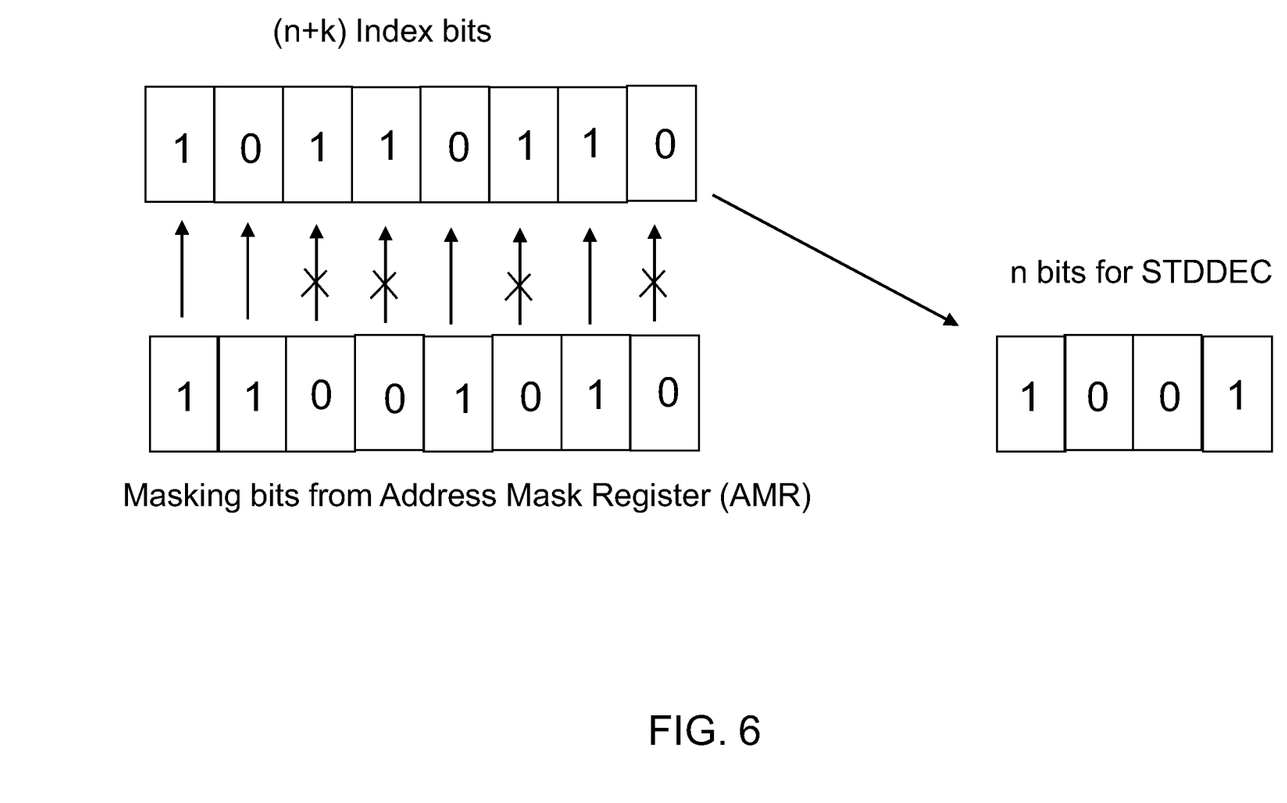
FIG. 6 is a schematic diagram illustrating the concept of index address masking using an address mask register (AMR) according to an embodiment of the present disclosure.

Referring to FIG. 6, the address masking procedure is highlighted. The index bits corresponding to the asserted bits of the AMR are preserved in the same order, and those corresponding to de-asserted bits of the AMR are dropped. Thus, 'n' bits out of the 'n+k' bits are filtered out to the STDDEC inputs. The address mark thus defines bits to be retained among the index bits (those bits corresponding to the asserted bites, i.e., "1" bits of the AMR), and bits to be deleted among the index bits (those bits corresponding to the de-asserted bits, i.e., "0" nits of the AMR). Therefore, using 'n' address masked bits to the STDDEC, the 'n+k' bits are written into the RCGDEC in the physical line corresponding to the 'n' address masked bits. Similarly, the data and tag array lines can also be written. During a read operation, the RCGDEC is used to pick out the line corresponding to the 'n+k' input bits. The RCGDEC is used during a read operation to prevent address aliasing. Thus, the direct-mapped nature of the cache is preserved to an extent, whereby each incoming line can only go to a fixed location, albeit, one that is controlled by the AMR, unlike traditional DM caches. Hence, this mode of operation involves write operation through the STDDEC and read operation through the RCGDEC. Thus, the address mask register is configured to receive index bits from address search lines, to retain a first subset of the index bits corresponding to asserted bits (e.g., "1" bits) of an address mask, to delete a second subset of the index bits corresponding to de-asserted bits (e.g., "0" bits) of the address mask, to provide the first subset of the index bits to the reconfigurable decoder to access a line of memory cells within the reconfigurable decoder corresponding to the first subset of the index bits, and to write the index bits to the line of memory cells.

Figure 7:
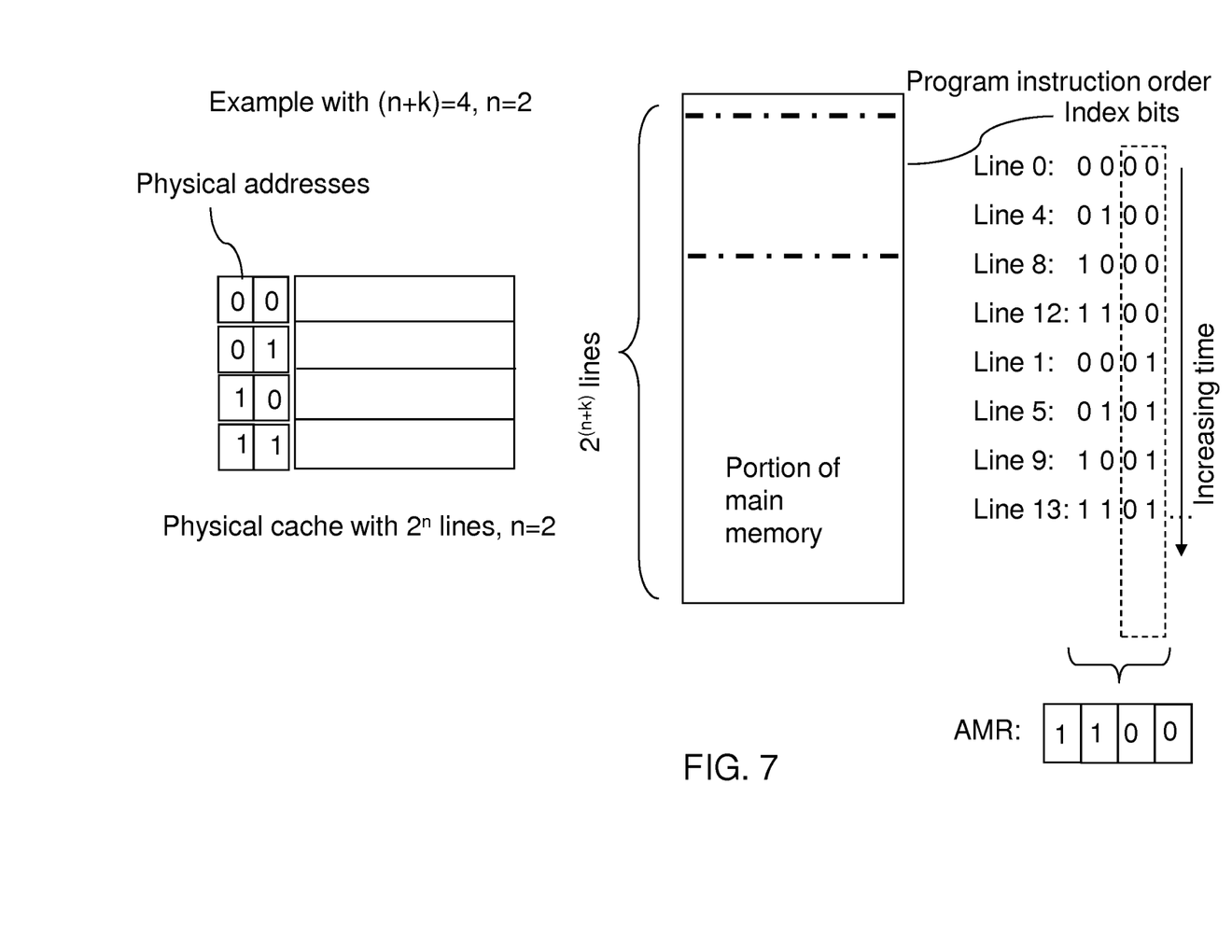
FIG. 7 is an examplary diagram illustrating the process of determining the AMR for mapping memory lines to cache lines according to an embodiment of the present disclosure.

Referring to FIG. 7, an illustrative example shows how a suitable memory to physical cache mapping can be chosen by looking at the program instruction order, with (n+k)=4, n=2. Here, 16 lines of memory need to be mapped to 4 available physical lines in the most efficient manner, i.e. avoiding conflict misses whenever possible. The instruction order of FIG. 7 enables a choice of AMR='1100', thereby screening away the last two index bits.

Figure 8:
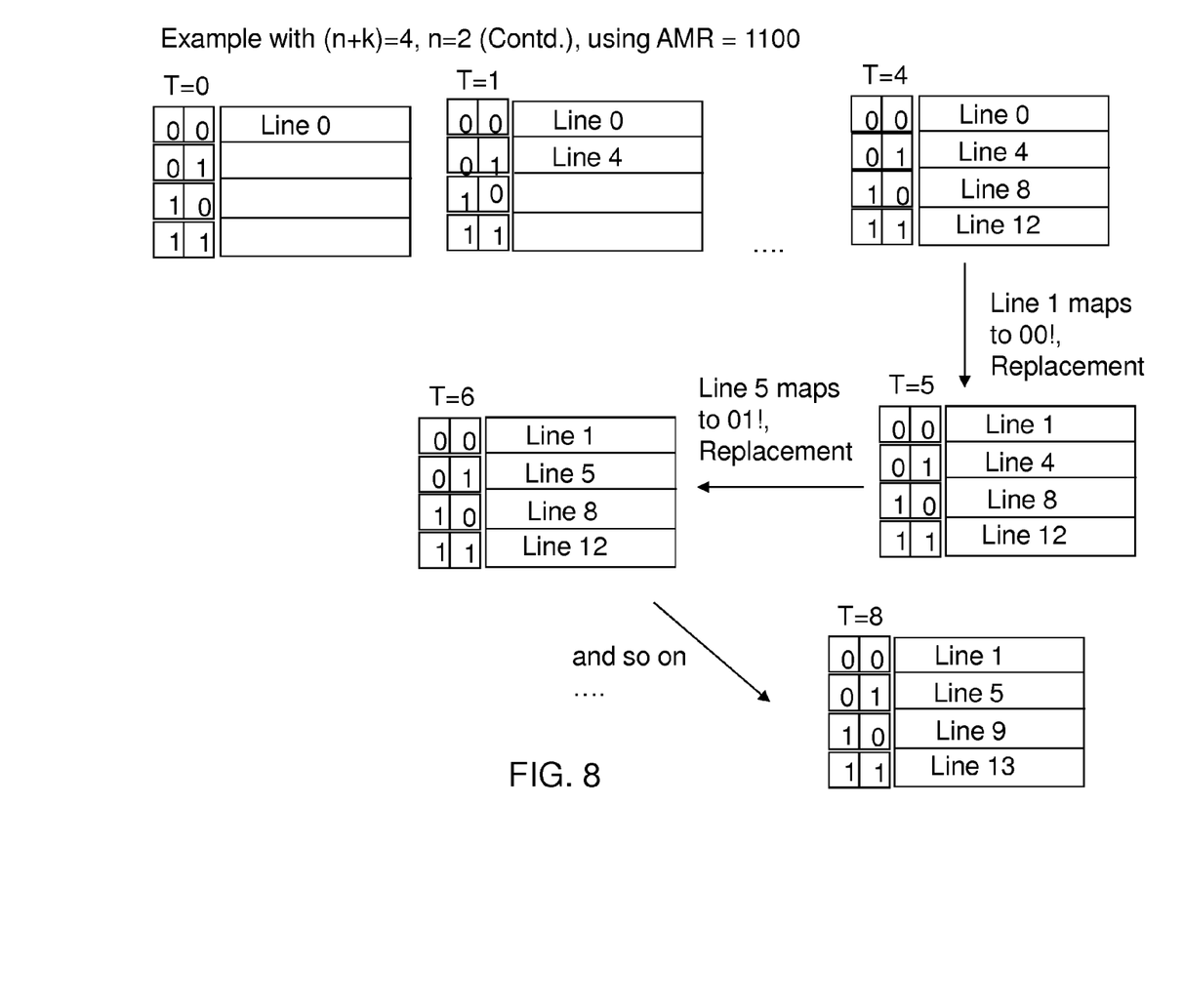
FIG. 8 is an examplary diagram illustrating the process by which cache lines are filled and replaced for the AMR illustrated in FIG. 7 according to an embodiment of the present disclosure.

Referring to FIG. 8, the physical cache state are shown at different points of time corresponding to AMR='1100'. Here, cache lines are filled sequentially, with only capacity misses.

Figure 9:
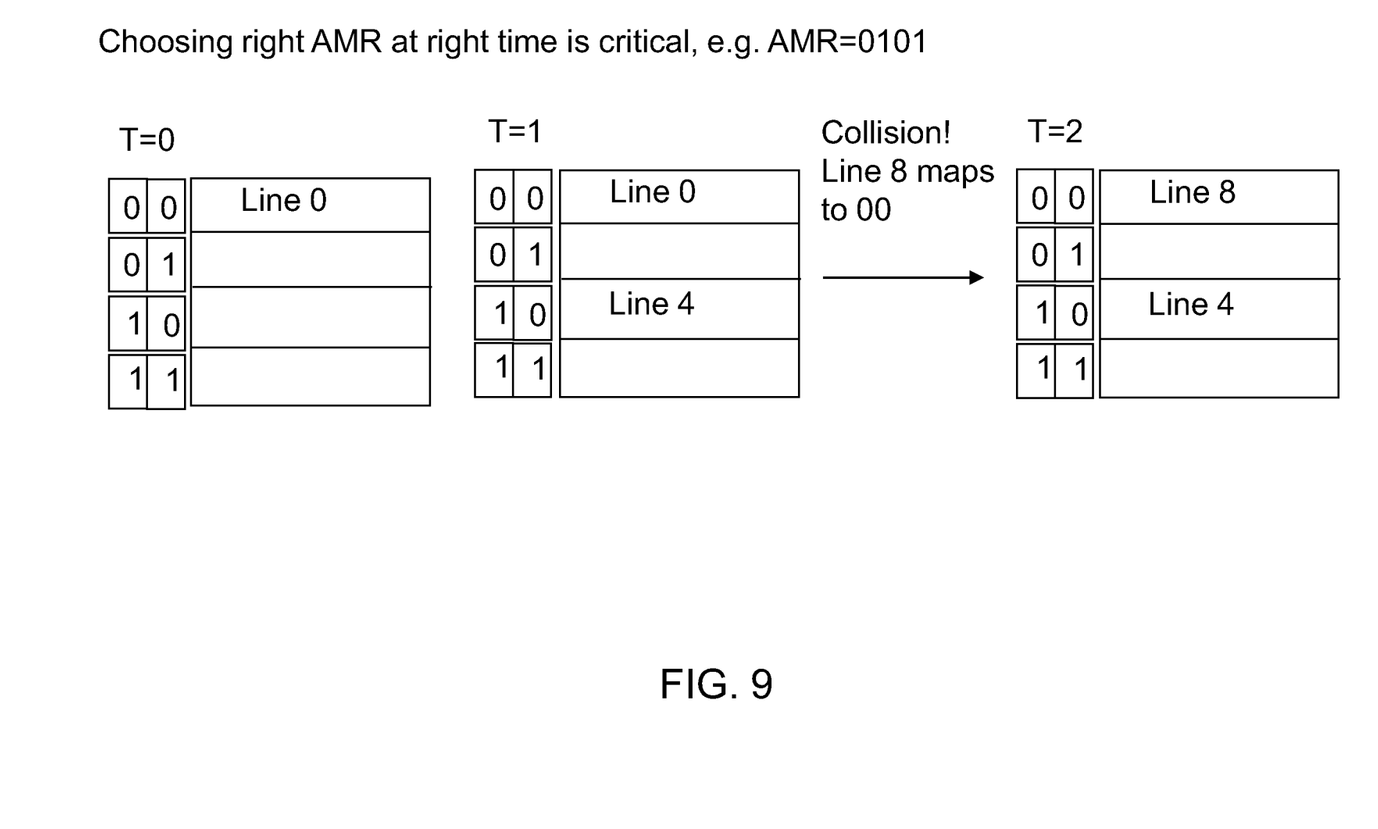
FIG. 9 is an examplary diagram illustrating a conflict miss on account of choosing an incorrect AMR according to an embodiment of the present disclosure.

FIG. 9 shows an example case where an incorrect AMR='0101' causes uncessary conflict misses. By choosing the correct AMR, conflict misses can be avoided to a large extent. The AMR can be set differently for each process either by the user or by the compiler in a fine-grained manner. Also, for a given process, the AMR can be different at different points of time, depending on the best way to utilize the physical cache. The AMR can be set statically for an entire process (e.g. legacy executable code) or dynamically changed during run-time. The optimal AMR can be determined by profiling code/user case traces. The AMR can be loaded from process space for each process and modified depending on the process currently in context. Thus, the AMR can make the physical cache organization look different at different points of time for different processes.

Address masking in FIG. 9 is optional, and can be made transparent for pathological cases where no AMR value can avoid conflict misses, thereby reverting back to FIG. 1.

In one embodiment, the AMR can be statically set within the user code. A sample pseudocode illustrating how the AMR can be set in a fine-grained fashion is shown below:
Branching code, user specifies AMR

```
Set AMR = [optimum value for Condition 1]
    Set AMR = [optimum value for Condition 1]
    <Code for Condition 1>
Elseif ( Condition 2):
    Set AMR = [optimum value for Condition 2]
    <Code for Condition 2>
Endif
Reset AMR = [optimum value for code below]
< The rest of the code>
```

In another embodiment, the AMR can be dynamically set from variables within the process space. A sample pseudocode illustrating how AMR can be dynamically set in a fine-grained fashion is shown below:
AMR specified dynamically from process space

```
Input v
Input Arr[1 to 1000]
# Next loop is going to jump by index v
Set AMR = AMR_process_space (v)
For (j=1, j<=1000, j=j+v)
    Arr[j] = Arr[j] + 1
End For
Reset AMR = [optimum value for code below]
< The rest of the code>
```

The embodiments of the present disclosure provide a comprehensive methodology for design and implementation of AIX caches. The 'self-reconfigurable' decoder of the present disclosure seamlessly integrates AIX capability into existing configurations. The semiconductor circuit of embodiments of the present disclosure can be a low power CAM cell based decoder. While the description of the present disclosure employs DM-AIX mode, the methods of the present disclosure can be employed to SA caches as well.

It has been held in the art that the miss rate of fully associative (FA) cache cannot be achieved with the speed of DM cache in the absence of index extension. In other words, a general limitation of methods known in the art was that miss rate cannot be reduced without affecting hit time in the absence of index extension.

Further, prior attempts for circuit implementation of index extension have resulted in impractical designs with many deficiencies. For example, decoder logic stages per word line were too high, and decoder initial condition was not accounted for, resulting in incorrect operation if two CAM rows are identical on startup. The methods of the present disclosure overcome these difficulties by employing a standard decoder on startup.

Still further, the method of the present disclosure enable separate banking operations in different cache access modes.

It is noted that any incoming line can land up in any bank in prior art methods. Thus, prior art methods require that all banks be triggered for each index search during read, resulting in impractically high power consumption. In contrast, current work provides index extension on a per bank basis. Thus, incoming line can go to only one bank, thereby circumventing the power issue. This feature of embodiments of the present disclosure makes it possible to independently operate some banks in DM mode and others in DM-AIX mode.

In addition, random line replacement is difficult to implement in prior art methods. This difficulty is overcome in the methods of embodiments of the present disclosure employing the standard decoder and fixed physical line addresses, i.e., by choosing a random number between 0 to N-1, or the fixed line addresses of the standard decoder, random line replacement can be achieved. This is impossible or difficult to do using only the RCGDEC.

Figure 10:
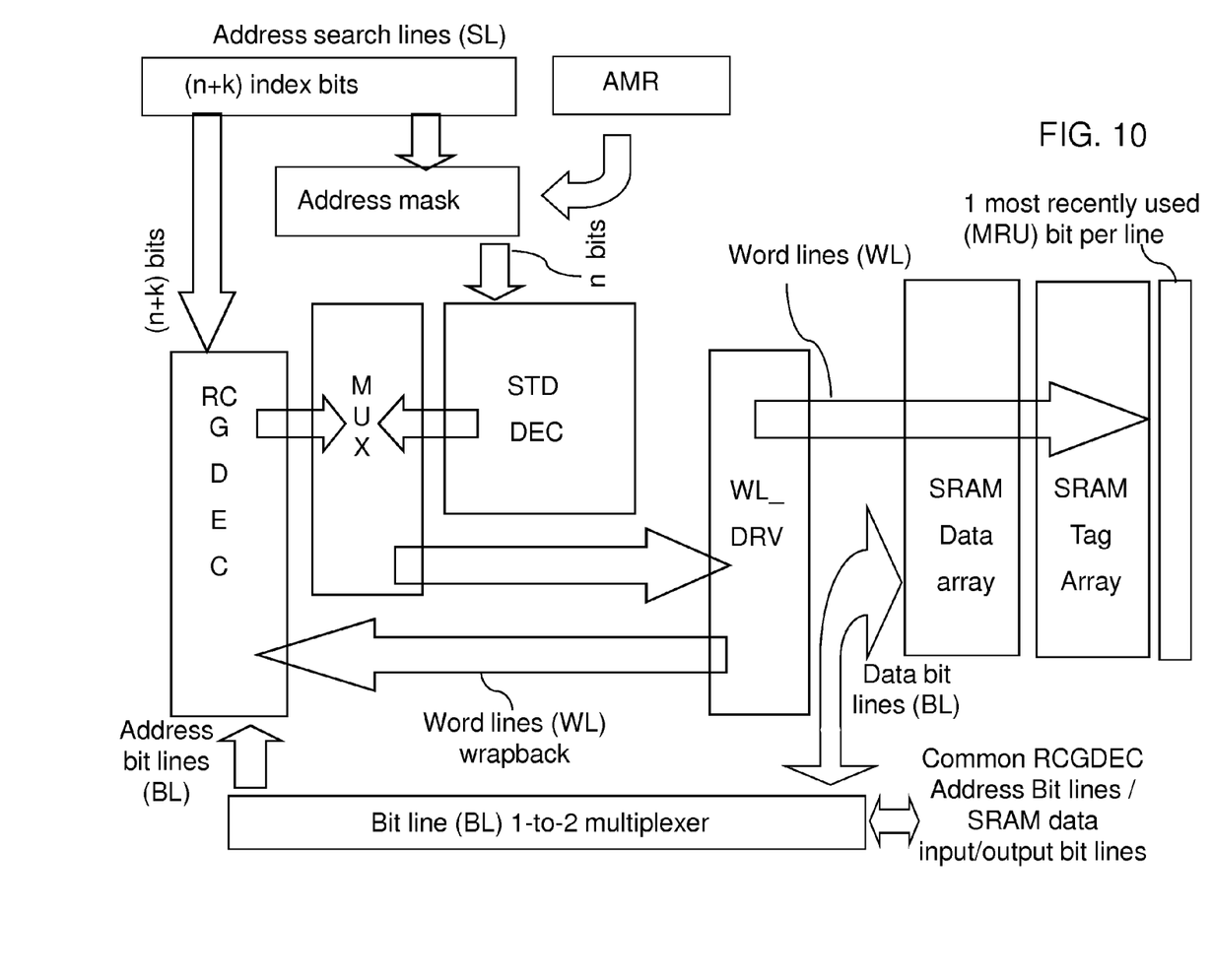
FIG. 10 is a schematic diagram illustrating the use of a most-recently-used-save (MRU-save) replacement policy as an extension to the DM-AIX cache in the variation of the semiconductor circuit illustrated in FIG. 5.

It is known in prior art that random line replacement can perform poorly as it can evict cache lines which are frequently used, thereby causing unnecessary misses. FIG. 10 shows an implementation of a most-recently-used (MRU-save) scheme that can be used in conjunction with the RCGDEC with or without address masking. It involves devoting a single MRU bit per physical tag array line. The tag array is divided into 'R' regions and in each region, only one line is allowed to assert its MRU bit. Therefore, on an index miss, if a randomly chosen line has its MRU bit set, a non-MRU line in its region is chosen for replacement. This improves the miss rate as retaining an MRU line within its region saves cache misses. If a tag miss occurs, the new incoming line is marked MRU in its region. If a cache line hit occurs, the MRU bit is set for the line in its region. The array of memory cells can include a most recently used (MRU) bit per cache line. A cache line for storing new data can be selected among memory cells having MRU bits that do not indicate most recent usage (e.g., MRU bits storing "1"). As used herein, "most recent usage" means either last usage alone or a combination of last usage and second last usage.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A memory circuit comprising:
   at least one memory bank including an array of memory cells; and
   a decoder circuit comprising:
      a reconfigurable decoder, wherein a relationship between address bits provided through address search lines to said reconfigurable decoder and data lines within a decoder memory of said reconfigurable decoder is programmable within said reconfigurable decoder based on an input to said reconfigurable decoder provided through said address search lines;
      another decoder configured to access said at least one memory bank in direct mapped cache access mode; and
      a multiplexer configured to generate a multiplexed output by selecting an output from a first output of said another decoder and a second output of said reconfigurable decoder depending on a cache access scheme in use.

2. The memory circuit of Claim 1, wherein said address search lines are connected to said another decoder and said reconfigurable decoder, and said another decoder and said reconfigurable decoder are configured to generate said first output or said second output, respectively, based on an address input to said address search lines.

3. The memory circuit of Claim 1, further comprising a word line driver configured to drive a word line selected by said multiplexed output among a plurality of word lines in said array of memory cells.

4. The memory circuit of claim 3, wherein each of said plurality of word lines is configured to drive a row of decoder memory cells in said reconfigurable decoder.

5. The memory circuit of claim 3, wherein said word line driver is configured to access word lines of decoder memory cells within said reconfigurable decoder.

6. A memory circuit comprising:
   at least one memory bank including an array of memory cells;
   a decoder circuit comprising a reconfigurable decoder, wherein a relationship between address bits provided through address search lines to said reconfigurable decoder and data lines within a decoder memory of said reconfigurable decoder is programmable within said reconfigurable decoder based on an input to said reconfigurable decoder provided through said address search lines: and
   an address mask register configured to receive index bits from address search lines, to retain a first subset of said index bits corresponding to asserted bits of an address mask, to delete a second subset of said index bits corresponding to de-asserted bits of said address mask, to provide said first subset of said index bits to said reconfigurable decoder to access a line of memory cells within said reconfigurable decoder corresponding to said first subset of said index bits, and to write said index bits to said line of memory cells.

7. A method of operating a memory circuit comprising:
   providing the memory circuit of claim 1, wherein said decoder circuit is configured to access a row of said array of memory cells through two alternate cache access schemes including direct mapped cache access mode through another decoder and associative index extended cache access mode through said reconfigurable decoder;
   operating said memory circuit in said direct mapped cache access mode through said another decoder during a first time period; and
   operating said memory circuit in said associative index extended cache access mode through said reconfigurable decoder during a second time period.

8. A method of operating a memory circuit comprising:
   proving the memory circuit of claim 1, wherein said decoder circuit is configured to access a row of said array of memory cells through two alternate cache access schemes including direct mapped cache access mode through another decoder and associative index extended cache access mode through said reconfigurable decoder; and
   operating a portion of said at least one memory bank in said direct mapped cache access mode through said another decoder and another portion of said at least one memory bank in said associative index extended cache access mode through said reconfigurable decoder.

9. A method of operating a memory circuit comprising:
providing the memory circuit of claim 1, wherein said reconfigurable decoder comprises an array of decoder memory cells; and
storing data unrelated to data stored in said memory bank in said array of decoder memory cells.

10. A method of operating a memory circuit comprising:
providing the memory circuit of claim 1, wherein said array of memory cells comprises a most recently used (MRU) bit per cache line; and
selecting a cache line for storing new data among memory cells having MRU bits that do not indicate most recent usage.

11. A semiconductor circuit comprising:
at least one memory bank including an array of memory cells;
a reconfigurable decoder comprising an array of content addressable memory (CAM) cells, wherein a relationship between address bits provided through address search lines to said reconfigurable decoder and data lines within a decoder memory of said reconfigurable decoder is programmable within said reconfigurable decoder based on an input to said reconfigurable decoder provided through said address search lines,
wherein said reconfigurable decoder is configured to provide an output to a multiplexer based on an address input, and said semiconductor circuit further comprises:
another decoder configured to provide another output to said multiplexer based on said address input; and
a word line driver configured to drive a word line of at least one memory bank selected by a multiplexed output from said multiplexer.

12. The semiconductor circuit of claim 11, wherein each word line driven by said word line driver is a common word line for a row of memory cells in said at least one memory bank and for a row of said array of CAM cells, and common address search lines are connected to said another decoder and said reconfigurable decoder and are configured to provide said address input.

13. The semiconductor circuit of claim 11, further comprising another multiplexer configured to provide address bits through address bit lines connected to said reconfigurable decoder and to communicate data bits through data bit lines connected to said at least one memory bank, and said at least one memory bank comprises a plurality of word lines, and each of said plurality of word lines is configured to drive a row of decoder memory cells in said second decoder.

14. The semiconductor circuit of claim 13, wherein each of said plurality of word lines extends into said array of CAM cells as a word line of said array of CAM cells.

15. The semiconductor circuit of claim 11, wherein said word line driver is configured to access a selected word line of said array of CAM cells, wherein said word line driver determines said selected word line based on said multiplexed output.

16. A method of operating a semiconductor circuit comprising:
providing the semiconductor circuit of claim 11; and
resolving an address unavailability or an address conflict during a read operation by:
altering contents of an array of the decoder memory cells in said reconfigurable decoder in order to reassign or remove an address corresponding to said address unavailability or said address conflict;
activating word lines within said reconfigurable decoder employing a search address on search lines provided to said reconfigurable decoder; and
writing a new address that is supplied through bit lines of said array of CAM cells into corresponding CAM cells.

17. A method of operating a semiconductor circuit comprising:
providing the memory circuit of claim 11, wherein said decoder circuit is configured to access a row of said array of memory cells through two alternate cache access schemes including direct mapped cache access mode through another decoder and associative index extended cache access mode through said reconfigurable decoder;
operating said semiconductor circuit in direct mapped cache access mode through said another decoder during a first time period; and
operating said semiconductor circuit in associative index extended cache access mode through said reconfigurable decoder during a second time period.

18. A method of operating a semiconductor circuit comprising:
providing the memory circuit of claim 11, wherein said decoder circuit is configured to access a row of said array of memory cells through two alternate cache access schemes including direct mapped cache access mode through another decoder and associative index extended cache access mode through said reconfigurable decoder; and
operating a portion of said at least one memory bank in direct mapped cache access mode through said another decoder and another portion of said at least one memory bank in associative index extended cache access mode through said reconfigurable decoder.

19. A method of operating a semiconductor circuit comprising:
providing the semiconductor circuit of claim 11; and
storing in said array of CAM cells data unrelated to data stored in said semiconductor bank.

* * * * *